(12) United States Patent
Kwak et al.

(10) Patent No.: US 12,211,976 B2
(45) Date of Patent: Jan. 28, 2025

(54) BATTERY INCLUDING FLEXIBLE CIRCUIT BOARD CONNECTED FROM SIDE OF PRINTED CIRCUIT BOARD, AND ELECTRONIC DEVICE INCLUDING THE BATTERY

(71) Applicant: Samsung Electronics Co., Ltd., Suwon-si (KR)

(72) Inventors: Woongeun Kwak, Suwon-si (KR); Jungsik Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/512,862

(22) Filed: Nov. 17, 2023

(65) Prior Publication Data

US 2024/0088458 A1    Mar. 14, 2024

Related U.S. Application Data

(63) Continuation of application No. 16/734,623, filed on Jan. 6, 2020, now Pat. No. 11,824,151.

(30) Foreign Application Priority Data

Jan. 7, 2019    (KR) .................. 10-2019-0001951

(51) Int. Cl.
*H01M 10/42*    (2006.01)
*H01M 50/178*    (2021.01)
(Continued)

(52) U.S. Cl.
CPC ..... *H01M 10/4257* (2013.01); *H01M 50/178* (2021.01); *H01M 50/211* (2021.01);
(Continued)

(58) Field of Classification Search
CPC .. H01M 10/4257; H01M 50/172; H01M 2/06; H01M 10/425; H05K 1/028; H05K 2201/10037; H05K 3/361
See application file for complete search history.

(56) References Cited

U.S. PATENT DOCUMENTS 9,084,357 B2    7/2015    Shedletsky et al.
9,270,795 B2    2/2016    Endo et al.
(Continued)

FOREIGN PATENT DOCUMENTS

CN    108429838 A    8/2018
KR    10-2018-0074239 A    7/2018
(Continued)

OTHER PUBLICATIONS

Chinese Office Action dated Dec. 15, 2023, issued in Chinese Application No. 202080008312.0.
(Continued)

*Primary Examiner* — Maria Laios
*Assistant Examiner* — Jordan E Berresford
(74) *Attorney, Agent, or Firm* — Jefferson IP Law, LLP

(57) ABSTRACT

An electronic device is provided. The electronic device includes a housing, a main circuit board, a battery, a battery protection module disposed on one side surface of the battery, a protective holder that surrounds at least part of the battery protection module, and a flexible printed circuit board that extends from one side surface of the battery protection module and that is connected to the main circuit board. The flexible printed circuit board includes a first portion extending from the battery protection module in a second direction perpendicular to a first direction toward the main circuit board, a second portion extending from the first portion while being bent, a third portion extending from the second portion in a third direction opposite to the second
(Continued)

direction, a fourth portion extending from the third portion in the first direction, and a connector connected to an end portion of the fourth portion and connected to the main circuit board.

16 Claims, 13 Drawing Sheets

(51) Int. Cl.
*H01M 50/211* (2021.01)
*H01M 50/55* (2021.01)
*H01M 50/553* (2021.01)
*H05K 1/02* (2006.01)

(52) U.S. Cl.
CPC ......... *H01M 50/55* (2021.01); *H01M 50/553* (2021.01); *H05K 1/028* (2013.01); *H05K 2201/10037* (2013.01)

(56) References Cited

U.S. PATENT DOCUMENTS

| | | |
|---|---|---|
| 10,228,577 B2 | 3/2019 | Kwon |
| 10,542,632 B2 | 1/2020 | Kim et al. |
| 10,985,417 B2 | 4/2021 | Kim et al. |
| 11,031,636 B2 | 6/2021 | Cheong et al. |
| 2009/0207336 A1 | 8/2009 | Lee et al. |
| 2013/0040170 A1 | 2/2013 | Choi et al. |
| 2014/0071081 A1 | 3/2014 | Shedletsky et al. |
| 2014/0171159 A1 | 6/2014 | Endo et al. |
| 2015/0311568 A1 | 10/2015 | Byun et al. |
| 2016/0126999 A1 | 5/2016 | Endo et al. |
| 2016/0276647 A1 | 9/2016 | Lee et al. |
| 2017/0290184 A1 | 10/2017 | Kim et al. |
| 2018/0183112 A1 | 6/2018 | Cheong et al. |
| 2018/0261900 A1 | 9/2018 | Kim et al. |
| 2018/0314091 A1 | 11/2018 | Kwon |

FOREIGN PATENT DOCUMENTS

| | | |
|---|---|---|
| KR | 10-2018-0103625 A | 9/2018 |
| WO | 2018/117567 A1 | 6/2018 |

OTHER PUBLICATIONS

International Search Report dated May 27, 2020, issued in International Patent Application No. PCT/KR2020/000191.

Extended European Search Report dated Dec. 7, 2021, issued in European Patent Application No. 20738134.4.

Korean Office Action dated Mar. 14, 2023, issued in Korean Patent Application No. 10-2019-0001951.

BATTERY INCLUDING FLEXIBLE CIRCUIT BOARD CONNECTED FROM SIDE OF PRINTED CIRCUIT BOARD, AND ELECTRONIC DEVICE INCLUDING THE BATTERY

CROSS-REFERENCE TO RELATED APPLICATION(S)

This application is a continuation application of prior application Ser. No. 16/734,623, filed on Jan. 6, 2020, which claimed priority under 35 U.S.C. § 119(a) of a Korean patent application number 10-2019-0001951, filed on Jan. 7, 2019, in the Korean Intellectual Property Office, the disclosure of which is incorporated by reference herein in its entirety.

BACKGROUND

1. Field

The disclosure relates to a battery including a flexible circuit board connected from a side of a printed circuit board, and an electronic device including the battery.

2. Description of the Related Art

An electronic device, such as a smartphone or a tablet personal computer (PC), may play a video or music, may do a search on the Internet, or may perform wireless communication. The electronic device may include a battery for mobility. The battery may be charged through an external power source connected to a connector or through a wireless charging device. The battery may supply the charged power to a camera module, a display module, various elements mounted on a circuit board, communication circuitry, an antenna, and a sensor that are included in the electronic device.

The above information is presented as background information only to assist with an understanding of the disclosure. No determination has been made, and no assertion is made, as to whether any of the above might be applicable as prior art with regard to the disclosure.

SUMMARY

An electronic device in the related art may include on one side surface of a battery thereof, a battery protection module (e.g., a protection circuit module (PCM)) and a protective holder (e.g., a PCM holder) that surrounds the battery protection module. The battery protection module may be electrically connected with a main circuit board through a flexible printed circuit board.

The flexible printed circuit board may include V/W bending or S bending. When the battery is moved due to the fall of the electronic device or the impact on the electronic device, the V/W bending or the S bending may perform a buffer function to prevent the flexible printed circuit board from being separated from the battery or the main circuit board.

When the flexible printed circuit board includes the V/W bending, the electronic device in the related art has to have a hole or an opening corresponding to the battery protection module. Furthermore, when the flexible printed circuit board includes the S bending, the electronic device in the related art has a problem in that other elements cannot be disposed around and below the S bending, which results in a reduction in the area for utilization of the main circuit board.

Aspects of the disclosure are to address at least the above-mentioned problems and/or disadvantages and to provide at least the advantages described below.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a main circuit board disposed in the housing, a battery disposed in the housing and electrically connected to the main circuit board, a battery protection module disposed on one side surface of the battery and electrically connected to the inside of the battery, a protective holder that surrounds at least part of the battery protection module, and a flexible printed circuit board that extends from one side surface of the battery protection module and that is connected to the main circuit board. The flexible printed circuit board includes a first portion extending from the battery protection module in a second direction perpendicular to a first direction toward the main circuit board, a second portion extending from the first portion while being bent, a third portion extending from the second portion in a third direction opposite to the second direction, a fourth portion extending from the third portion in the first direction, and a connector connected to an end portion of the fourth portion and connected to the main circuit board.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
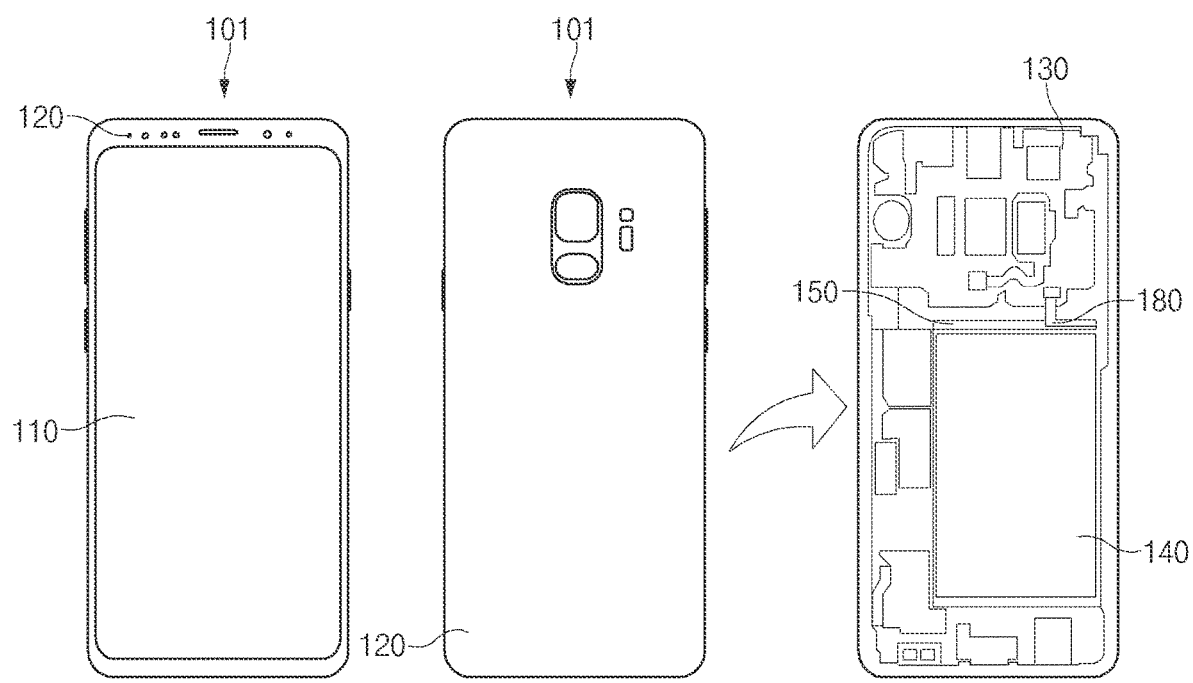
FIG. 1 illustrates an electronic device according to an embodiment of the disclosure.

FIG. 1 illustrates an electronic device according to an embodiment of the disclosure.

Referring to FIG. 1, the electronic device 101 may include a display 110 and a housing (or a main body) 120.

The display 110 according to various embodiments may include, for example, a liquid crystal display (LCD), a light emitting diode (LED) display, an organic light emitting diodes (OLED) display, a microelectromechanical systems (MEMS) display, or electronic paper. For example, the display 110 may display various types of contents (e.g., text, images, videos, icons, and/or symbols) to a user. The display 110 may include a touch screen and may receive, for example, a touch, a gesture, a proximity, or a hovering input using an electronic pen or a part of the user's body.

The housing (or the main body) 120 according to various embodiments may have the display 110 mounted therein. The housing 120 may contain various components for driving the electronic device 101.

According to various embodiments, the housing 120 may contain a main circuit board 130, a battery 140, a battery protection module 150, and a flexible printed circuit board 180.

The main circuit board 130 according to various embodiments may have various elements mounted thereon and required for operations of the electronic device 101. For example, the main circuit board 130 may have a processor, a memory, a communication chip, or a sensor mounted thereon. The main circuit board 130 may include a power supply point. The power supply point may be a point to which the power of the battery 140 is supplied through the flexible printed circuit board 180. The main circuit board 130 may supply the power transferred through the power supply point to the mounted or connected elements.

The battery 140 according to various embodiments may store electrical energy depending on chemical properties. The battery 140 may supply power to the main circuit board 130 through the battery protection module 150 and the flexible printed circuit board 180. For example, the battery 140 may be implemented in a Li-ion type.

The battery protection module 150 according to various embodiments may prevent overcharge or over discharge of the battery 140 and may protect the battery 140 from over-current. For example, the battery protection module 150 may be a protection circuit module (PCM) or a protection circuit board (PCB). According to various embodiments, the battery protection module 150 may be surrounded by a protective holder (or a battery holder) (e.g., a PCM holder).

The flexible printed circuit board 180 may make a connection between the battery protection module 150 and the main circuit board 130. The flexible printed circuit board 180 may transfer power from the battery 140 to the power supply point of the main circuit board 130. A first end portion of the flexible printed circuit board 180 may be connected to the battery protection module 150. A second end portion of the flexible printed circuit board 180 may be connected to the power supply point of the main circuit board 130.

According to various embodiments, at least part of the flexible printed circuit board 180 may be bent in the shape of "U". For example, the flexible printed circuit board 180 may bent in the shape of "U" after extending from the first end portion by a predetermined length in a lateral outward direction of the electronic device 101 (a perpendicular direction to the direction in which the battery protection module 150 faces the main circuit board 130). The flexible printed circuit board 180, after being bent in the shape of "U", may be disposed to overlap the battery protection module 150 (refer to FIGS. 3 to 6).

Figure 2:
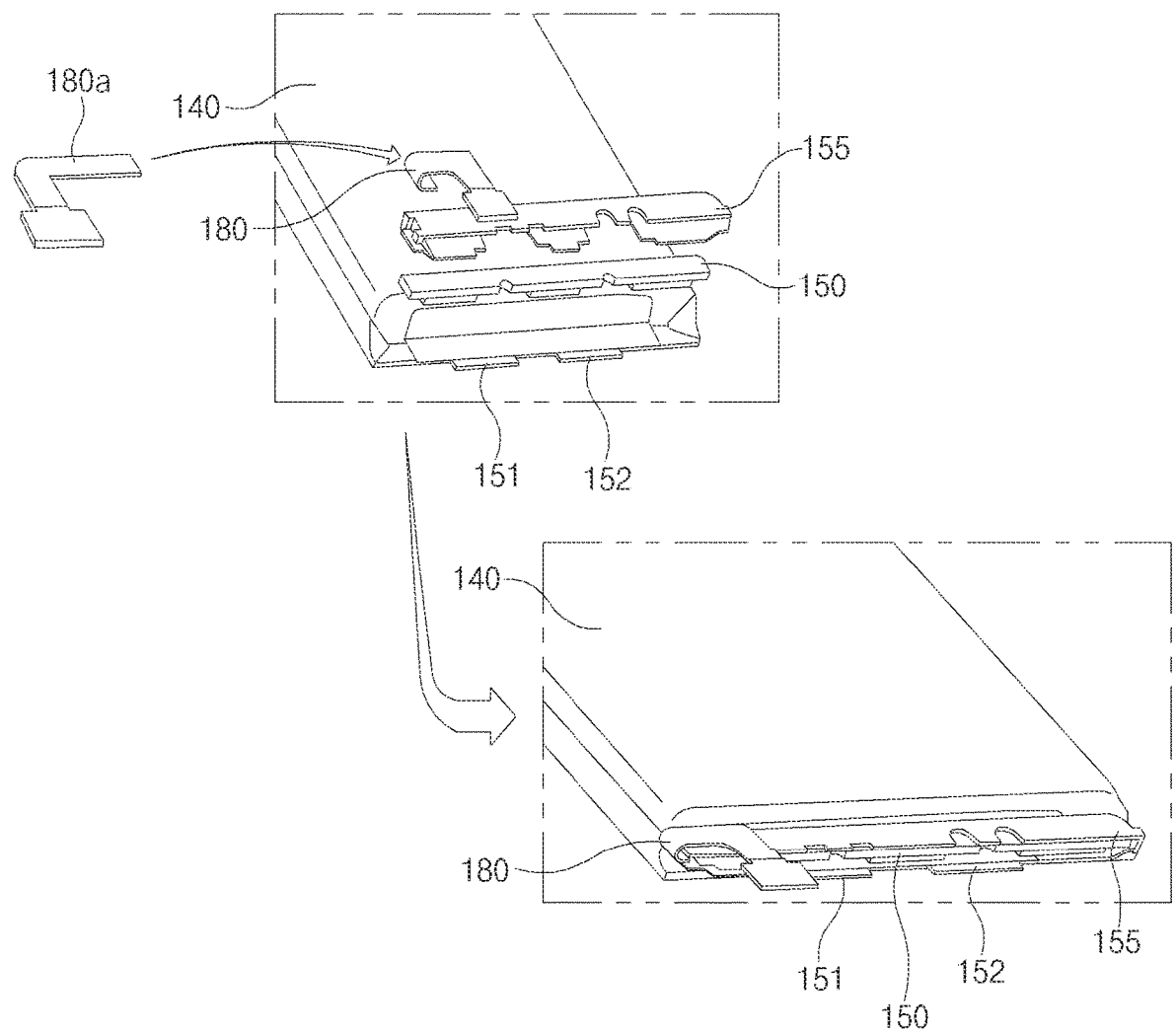
FIG. 2 illustrates components around a battery in an electronic device according to an embodiment of the disclosure.

FIG. 2 illustrates components around a battery according to an embodiment of the disclosure.

Referring to FIG. 2, the battery 140 may store electrical energy depending on chemical properties. For example, the battery (or the battery structure) 140 may include a positive electrode plate, a negative electrode plate, a separator, a jelly roll, and a pouch (or a battery pouch). The positive electrode plate and the negative electrode plate may be separated from each other by the separator. The positive electrode plate, the negative electrode plate, and the separator may form the jelly roll, and the jelly roll may be sealed with the pouch (e.g., polypropylene (PP)+nylon+Al).

The battery protection module (or the protection module) 150 according to various embodiments may be mounted on one side surface of the battery 140 (a side surface adjacent to the main circuit board 130). The battery protection module 150 may include a substrate, a protection integrated circuit (IC), a first tab 151, and a second tab 152 (refer to FIGS. 7A and 7B). The first tab 151 may be connected to a first electrode (the positive electrode plate) (e.g., Al) of the battery 140, and the second tab 152 may be connected to a second electrode (the negative electrode plate) (e.g., Cu) of the battery 140.

According to various embodiments, the battery protection module 150 may be surrounded by a protective holder (or a battery holder) 155. When the jelly roll in the battery 140 moves (e.g., when the electronic device 101 is subjected to a drop impact) in a state in which the protective holder 155 is not present, the battery protection module 150 may be broken, and the jelly roll may penetrate through the pouch and may be exposed outside the battery 140. In contrast, when the jelly roll in the battery 140 moves in a state in which the protective holder 155 is present, the protective holder 155 may support the jelly roll, thereby preventing the pouch of the battery 140 from bursting.

The flexible printed circuit board 180 may be connected to one side surface of the battery protection module 150. The flexible printed circuit board 180 may be connected to a side surface of the battery protection module 150 rather than the surface of the battery protection module 150 that faces the main circuit board 130 (the surface on which the first tab 151 and the second tab 152 are mounted).

According to an embodiment, the flexible printed circuit board 180 may have a planar form, in a state 180a of not being combined with the battery protection module 150. The flexible printed circuit board 180 may be at least partially bent in the shape of "U" when combined with the battery protection module 150. The flexible printed circuit board 180 may include a first portion connected to the battery protection module 150, a second portion bent from the first portion in the shape of "U", a third portion that extends from the second portion and that is stacked over the battery protection module 150, a fourth portion extending toward the main circuit board 130 from the third portion, and a connector connected to the main circuit board 130 (refer to FIG. 4).

According to various embodiments, part of the flexible printed circuit board 180 may be exposed outside the protective holder 155. The protective holder 155 may include an opening or a recess in a region adjacent to the flexible printed circuit board 180. The flexible printed circuit board 180 may extend outside the protective holder 155 through the opening or the recess.

Figure 3:
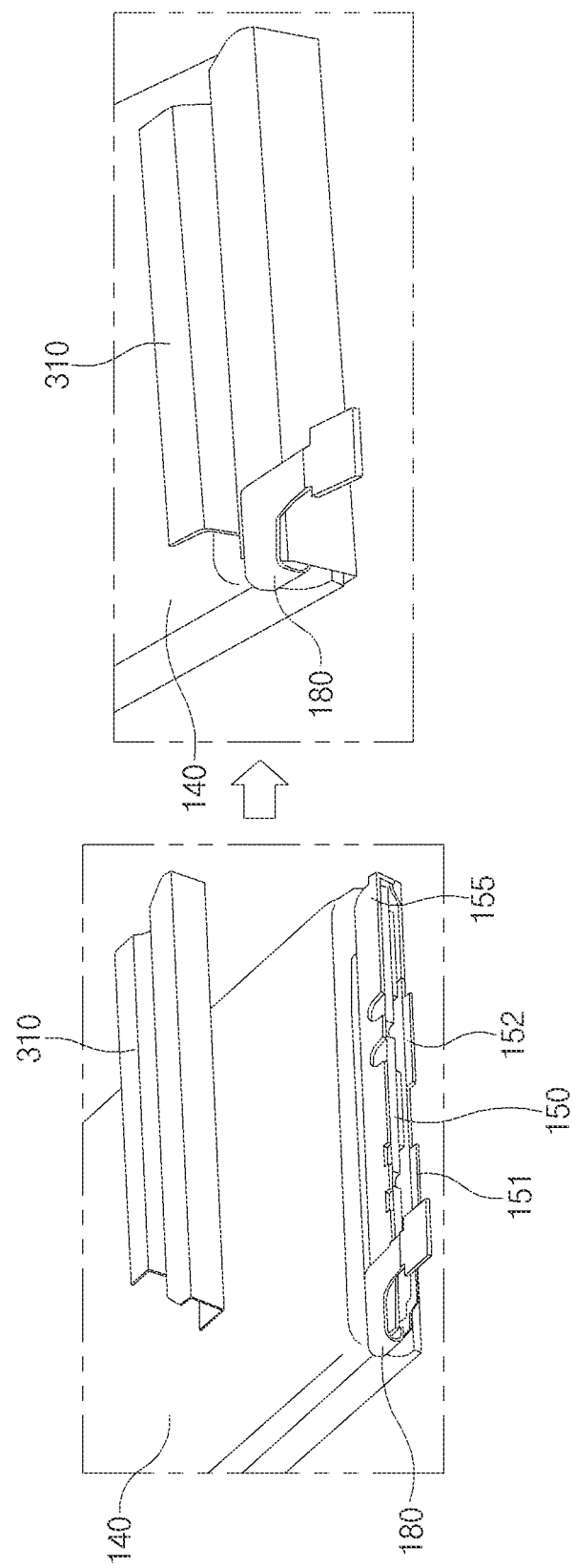
FIG. 3 illustrates attachment of a covering tape according to an embodiment of the disclosure.

FIG. 3 illustrates attachment of a covering tape according to an embodiment of the disclosure.

Referring to FIG. 3, the battery protection module 150 and the protective holder 155, which are connected to the battery 140, may be covered by the covering tape 310. The covering tape 310 may cover the side surface of the battery 140 to which the battery protection module 150 is connected, part of the upper surface of the battery 140 that is adjacent to the side surface, and part of the lower surface of the battery 140 that is opposite to the upper surface. The covering tape 310 may prevent a movement of the protective holder 155, thereby maintaining the forms of the battery protection module 150 and the protective holder 155 and the gap therebetween.

According to an embodiment, the flexible printed circuit board 180 may extend in a direction toward a side surface not covered by the covering tape 310, and part of the flexible printed circuit board 180 may be disposed over the covering tape 310. For example, the portion of the flexible printed circuit board 180 that extends from the U-shaped portion may be disposed over the covering tape 310 attached to the protective holder 155.

Figure 4:
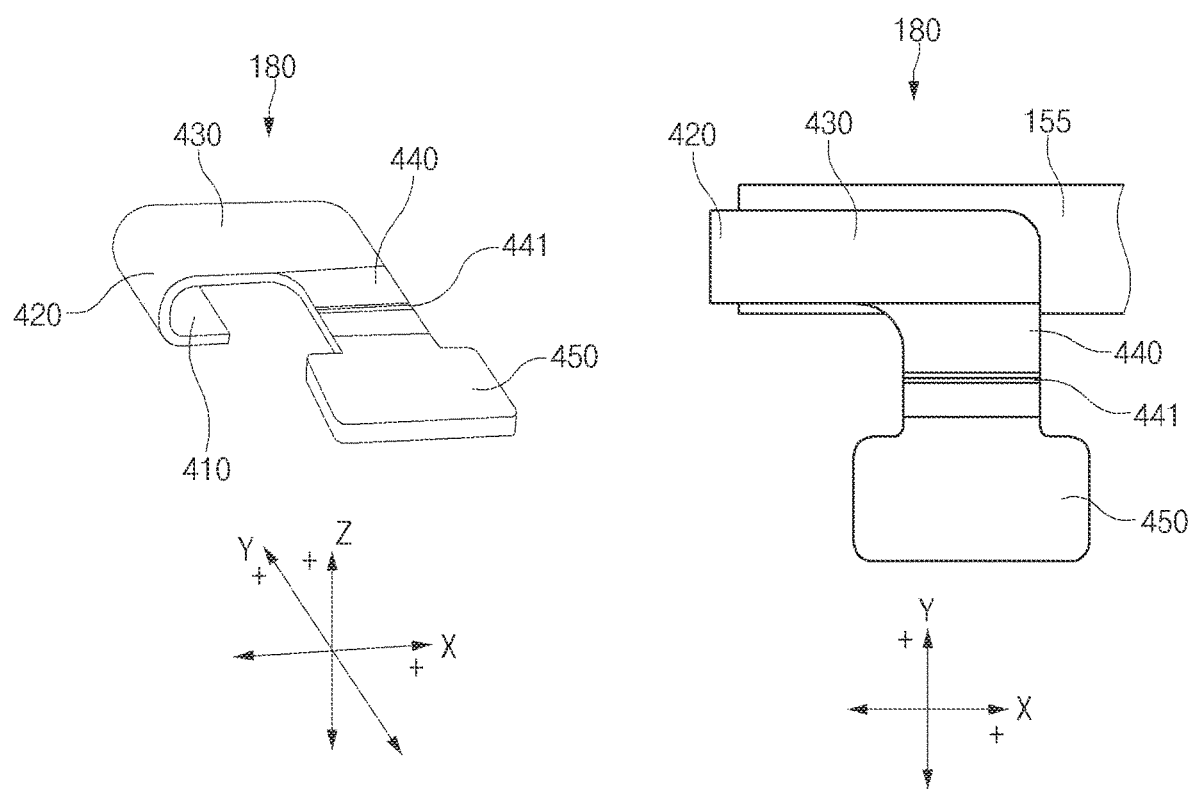
FIG. 4 illustrates a form of a flexible printed circuit board according to an embodiment of the disclosure.

FIG. 4 illustrates the form of the flexible printed circuit board according to an embodiment of the disclosure.

Referring to FIG. 4, the flexible printed circuit board 180 may include a first portion 410, a second portion 420, a third portion 430, a fourth portion 440, and a connector 450.

The first portion 410 (or the battery protection module connection portion) according to various embodiments may be a portion that is connected to the battery protection module 150. The first portion 410 may extend from the battery protection module 150 in a direction (hereinafter, referred to as the second direction (e.g., -x direction)) that is perpendicular to the direction toward the main circuit board 130 (or the direction in which the first tab 151 and the second tab 152 protrude) (hereinafter, referred to as the first direction (e.g., -y direction)). The second direction may be a direction toward the outside from the interior of the electronic device 101. The first portion 410 may be disposed on the same layer (the same plane) as the battery protection module 150.

Figure 7A:
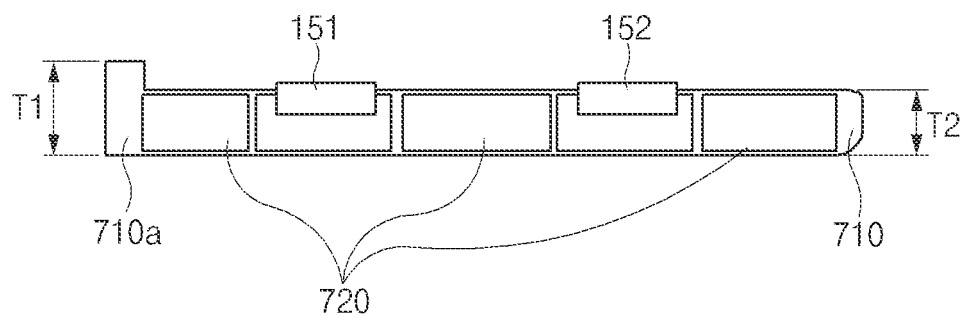
FIG. 7A illustrates a battery protection module according to an embodiment of the disclosure.

According to various embodiments, the width of the first portion 410 may be the same as, or similar to, the width of a connecting portion of the battery protection module 150 (e.g., a connecting portion 710a of FIG. 7A). In an embodiment, one side surface of the battery protection module 150 may have a greater width than the other portion of the battery protection module 150 (refer to FIGS. 7A and 7B). The electrical resistance of a conductor may be reduced with an increase in the width of the first portion 410.

The second portion 420 (or the curved portion) according to various embodiments may be a portion that is formed so as to be bent from the first portion 410 in the shape of "U" in a direction (e.g., +z direction) that is perpendicular to the first direction and the second direction. The curvature of the second portion 420 may be determined depending on material characteristics. The first portion 410 and the third portion 430 may form different layers by the second portion 420.

The third portion 430 (or the first extension) according to various embodiments may be a portion that extends from the second portion 420 in a third direction (e.g., +x direction) that is opposite to the second direction. The third portion 430 may be disposed on a different layer (a different plane) from the first portion 410 because the second portion 420 is bent in the shape of "U". Furthermore, the third portion 430 may be disposed on a different layer (a different plane) from the battery protection module 150. The third portion 430 may be disposed on an upper portion (an outer surface) of the battery protection module 150.

According to various embodiments, the third portion 430 may have a straight line form. The third portion 430 may extend parallel to the first portion 410 along the upper surface of the battery protection module 150 (or the upper surface of the protective holder 155). With an increase in the length of the third portion 430, the third portion 430 may better resist stress caused by an external impact (refer to FIG. 5).

The fourth portion 440 (or the second extension) according to various embodiments may be a portion that extends from the third portion 430 in the first direction (e.g., -y direction) toward the main circuit board 130. The fourth portion 440 may be disposed on the same layer (the same plane) as the third portion 430. The fourth portion 440, together with the third portion 430, may be formed in the shape of "L". The fourth portion 440 may be implemented in the form of a straight line or a curve. The fourth portion 440 may be implemented in various forms depending on the position of the power supply point of the main circuit board 130 and the form of the main circuit board 130.

The connector 450 according to various embodiments may be disposed on an end portion of the fourth portion 440. The connector 450 may be connected to a different connector of the main circuit board 130 (e.g., a connector paired with the connector 450). According to an embodiment, the flexible printed circuit board 180 may include, on an opposite surface to the surface on which the connector 450 is disposed, a pad implemented with a metallic material (e.g., Cu). According to various embodiments, the connector 450 may be in various forms. For example, the connector 450 may be implemented in a contact pad form. According to another embodiment, the connector 450 may be implemented with an electric wire connected through soldering.

According to various embodiments, the fourth portion 440 may include a V or W bending portion 441 on at least part thereof. The V or W bending portion 441 may improve a buffer function of the fourth portion 440 when the jelly roll in the battery 140 moves (e.g., when the electronic device 101 is subjected to a drop impact).

Although FIG. 4 illustrates the example that the fourth portion 440 includes the V or W bending portion 441, the disclosure is not limited thereto. For example, the flexible printed circuit board 180 may include a V or W bending portion on the first portion 410 or the third portion 430.

Figure 5:
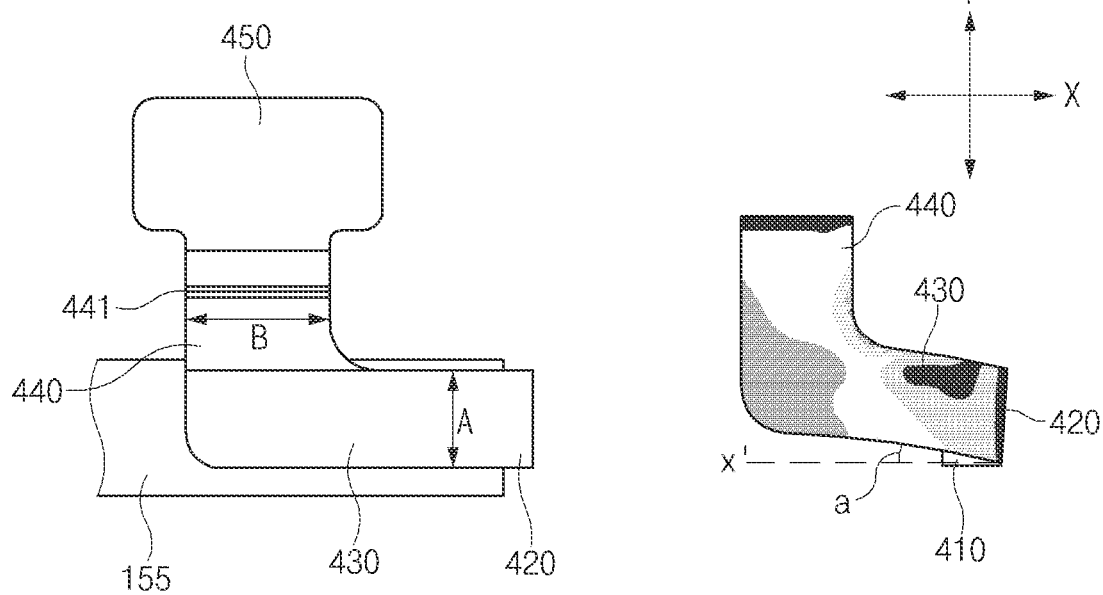
FIG. 5 illustrates a deformed form depending on a width of a flexible printed circuit board and stress according to an embodiment of the disclosure.

FIG. 5 illustrates a deformed form depending on a width of a flexible printed circuit board and stress according to an embodiment of the disclosure.

Referring to FIG. 5, the flexible printed circuit board 180 may include the first portion 410, the second portion 420, the third portion 430, the fourth portion 440, and the connector 450.

The first portion 410 may be disposed inside the protective holder 155, and the third portion 430, the fourth portion 440, and the connector 450 may be disposed outside the protective holder 155.

According to various embodiments, the first portion 410, the second portion 420, and the third portion 430 may have a first width A. The first width A may be determined depending on the width of the connecting portion of the battery protection module 150 (e.g., the connecting portion 710a of FIG. 7A) to which the first portion 410 is connected. The first width A may be smaller than the width of the battery protection module 150.

The fourth portion 440 may have a second width B greater than the first width A. With an increase in the second width B, electrical resistance (e.g., direct current (DC) resistance) that occurs in the fourth portion 440 may be reduced. The fourth portion 440 may include the V or W bending portion 441.

When the jelly roll in the battery 140 moves (e.g., when the electronic device 101 is subjected to a drop impact), the first to fourth portions 410 to 440 may deform, and the flexible printed circuit board 180 may be elongated in an up/down direction (Y-axis direction). Accordingly, the flexible printed circuit board 180 may be prevented from being separated from the main circuit board 130 or the battery protection module 150.

When the first to fourth portions 410 to 440 deform, the first to fourth portions 410 to 440 may be subjected to stress induced by the deformation. The first portion 410, the second portion 420, and the third portion 430 may be subjected to a larger stress than the fourth portion 440. The fourth portion 440 may be subjected to a smaller stress than the first portion 410, the second portion 420, and the third portion 430.

When the electronic device 101 is subjected to a drop impact, the angle "a" between the third portion 430 and the straight line x' parallel to the X axis may be increased. With an increase in the length of the third portion 430, the angle "a" capable of coping with a movement of the battery 140 may be increased, and an effective response to the external impact may be made.

When the electronic device 101 is subjected to a drop impact, the fourth portion 440 may be elongated by the V or W bending portion 441 of the fourth portion 440. Accordingly, an effective response to the external impact may be made.

Figure 6:
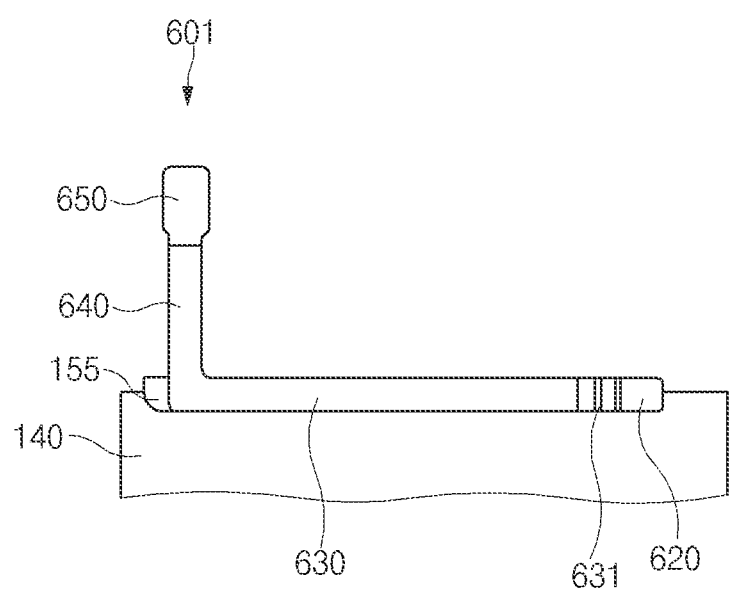
FIG. 6 illustrates a form of a flexible printed circuit board over a protective holder according to an embodiment of the disclosure.

FIG. 6 illustrates a form of a flexible printed circuit board over a protective holder according to an embodiment of the disclosure.

Referring to FIG. 6, the flexible printed circuit board 601 (e.g., the flexible printed circuit board 180) may include a first portion (not illustrated) (e.g., the first portion 410), a second portion 620 (e.g., the second portion 420), a third portion 630 (e.g., the third portion 430), a fourth portion 640 (e.g., the fourth portion 440), and a connector 650 (e.g., the connector 450).

The third portion 630 of the flexible printed circuit board 601 may be disposed over the protective holder 155. The third portion 630 may extend from the second portion 620 having a curved form along an upper surface of the protective holder 155.

According to various embodiments, the length of the third portion 630 may be the same as, or similar to, the length of the protective holder 155. The width of the third portion 630 may be equal to, or smaller than, the width of the protective holder 155.

According to various embodiments, the third portion 630 may be longer than the fourth portion 640. With an increase in the length of the third portion 630, the third portion 630 may effectively cope with a movement of the battery 140, thereby preventing damage caused by an impact.

According to various embodiments, the third portion 630 may include a V or W bending portion 631 on at least part thereof. The V or W bending portion 631 may improve a buffer function of the third portion 630 when the jelly roll in the battery 140 moves (e.g., when the electronic device 101 is subjected to a drop impact).

Although FIG. 6 illustrates the example that the third portion 630 includes one V or W bending portion 631, the disclosure is not limited thereto. For example, a plurality of V or W bending portions 631 may be disposed at specified intervals.

FIG. 7A illustrates a battery protection module according to an embodiment of the disclosure.

Referring to FIG. 7A, the battery protection module 150 may include a substrate 710, protection ICs 720, the first tab 151, and the second tab 152. The substrate 710 may have the protection ICs 720, the first tab 151, and the second tab 152 mounted thereon and may electrically connect the protection ICs 720, the first tab 151, and the second tab 152. The protection ICs 720 may prevent overcharge or over discharge of the battery 140 and may protect the battery 140 from over-current. The first tab 151 may be connected to the first electrode (the positive electrode plate) of the battery 140, and the second tab 152 may be connected to the second electrode (the negative electrode plate) of the battery 140.

According to various embodiments, the substrate 710 may include, on a side surface thereof (a surface rather than the surface facing the main circuit board 130 or the battery 140), the connecting portion 710a connected to the flexible printed circuit board 180.

According to an embodiment, the width T1 of the connecting portion 710a may be greater than the width T2 of the other region of the substrate 710. The width of the first portion 410 of the flexible printed circuit board 180 connected to the connecting portion 710a may be determined based on the width T1 of the connecting portion 710a. With an increase in the width T1 of the connecting portion 710a, electrical resistance in the first to third portions 410, 420, and 430 of the flexible printed circuit board 180 may be reduced. According to various embodiments, the connecting portion 710a may be disposed over a partition between the main circuit board 130 and the battery 140 (refer to FIG. 8).

Figure 7B:
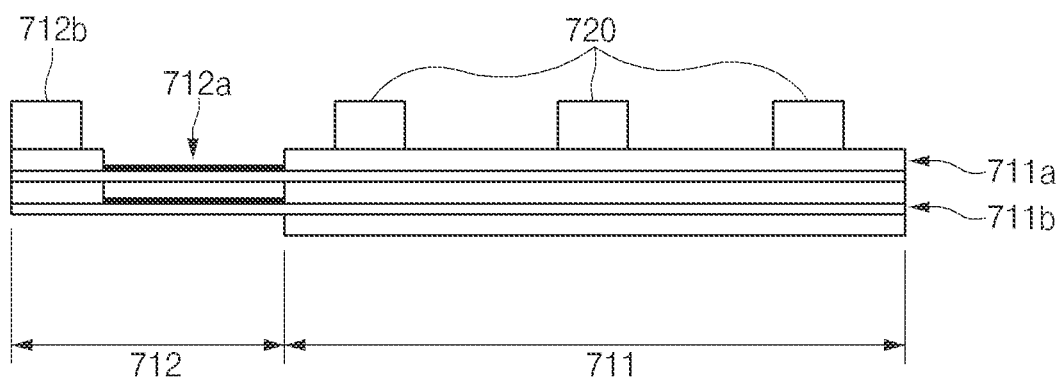
FIG. 7B is a sectional view of a substrate included in a battery protection module according to an embodiment of the disclosure.

FIG. 7B is a sectional view of a substrate included in a battery protection module according to an embodiment of the disclosure.

Referring to FIG. 7B, the substrate 710 may include a fixed region 711 and a flexible region 712.

The fixed region 711 according to various embodiments may be a region in which pre-pregs (PPGs) 711a and base films 711b (containing Cu) are alternately stacked on each other. The fixed region 711 may have the protection ICs 720 mounted thereon.

The flexible region 712 according to various embodiments may be a region from which the pre-pregs (PPGs) 711a are at least partially removed. The flexible region 712 may include coverlay films 712a with which the base films 711b (containing Cu) are coated. The flexible region 712 may have flexibility due to the removal of the pre-pregs (PPGs) 711a. The flexible region 712 may include a connector 712b for connecting the flexible printed circuit board 180.

Figure 8:
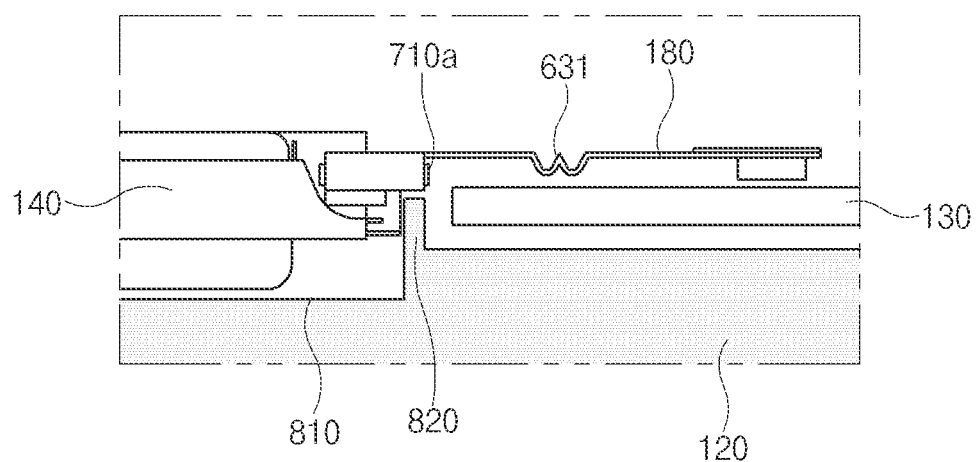
FIG. 8 is a sectional view of components around a main circuit board and a battery according to an embodiment of the disclosure.

FIG. 8 is a sectional view of components around a main circuit board and a battery according to an embodiment of the disclosure.

Referring to FIG. 8, the electronic device 101 may include a battery seating area 810 on which the battery 140 is seated.

The battery seating area 810 according to various embodiments may include a battery partition 820 for separating the battery 140 from the main circuit board 130. The battery partition 820 may be disposed to have a specified gap with the battery 140 and may therefore cope with a movement of the battery 140.

According to various embodiments, the battery partition 820 may have a relatively small height in a region adjacent to the connecting portion 710a of the battery protection module 150. The connecting portion 710a of the battery protection module 150 may be a portion to which the flexible printed circuit board 180 is connected. The connecting portion 710a of the battery protection module 150 may have a width greater than the width of the other portion of the battery protection module 150 to ensure the width of the flexible printed circuit board 180.

The connecting portion 710a of the battery protection module 150 may be disposed over the battery partition 820 to have a specified gap with the battery partition 820 and cover the battery partition 820 when viewed from above.

The flexible printed circuit board 180 may include a V or W bending portion over the main circuit board 130. When the jelly roll in the battery 140 moves (e.g., when the electronic device 101 is subjected to a drop impact), the V or W bending portion allows the flexible printed circuit board 180 to be elongated, thereby performing a buffer function.

Figure 9A:
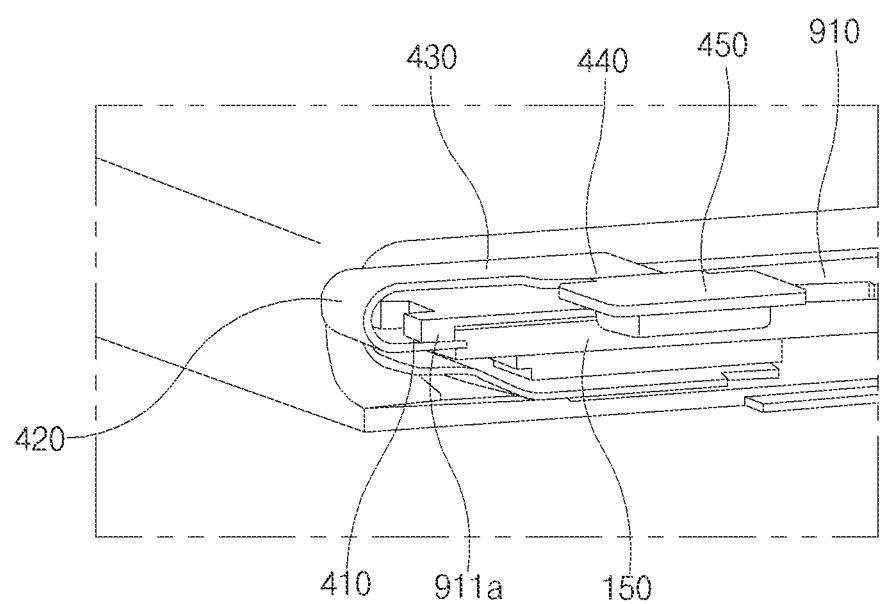
FIGS. 9A and 9B illustrate examples of a protective holder according to various embodiments of the disclosure.

FIG. 9A illustrates an example of a protective holder according to an embodiment of the disclosure.

Referring to FIG. 9A, the battery protection module 150 may be surrounded by a protective holder 910 (e.g., the protective holder 155). When the jelly roll in the battery 140 moves (e.g., when the electronic device 101 is subjected to a drop impact), the protective holder 910 may prevent the pouch of the battery 140 from bursting.

According to an embodiment, the protective holder 910 may include, in a side surface thereof (a surface not facing the main circuit board 130 or the battery 140), an opening 911a through which the flexible printed circuit board 180 passes. The first portion 410 or the second portion 420 of the flexible printed circuit board 180 may be connected to the outside of the protective holder 910 through the opening 911a. The third portion 430 of the flexible printed circuit board 180 may be disposed over the protective holder 910.

When part of the flexible printed circuit board 180 is disposed outside the protective holder 910, an extension range may be widened depending on an external impact, and the flexible printed circuit board 180 may more efficiently resist stress.

Figure 9B:
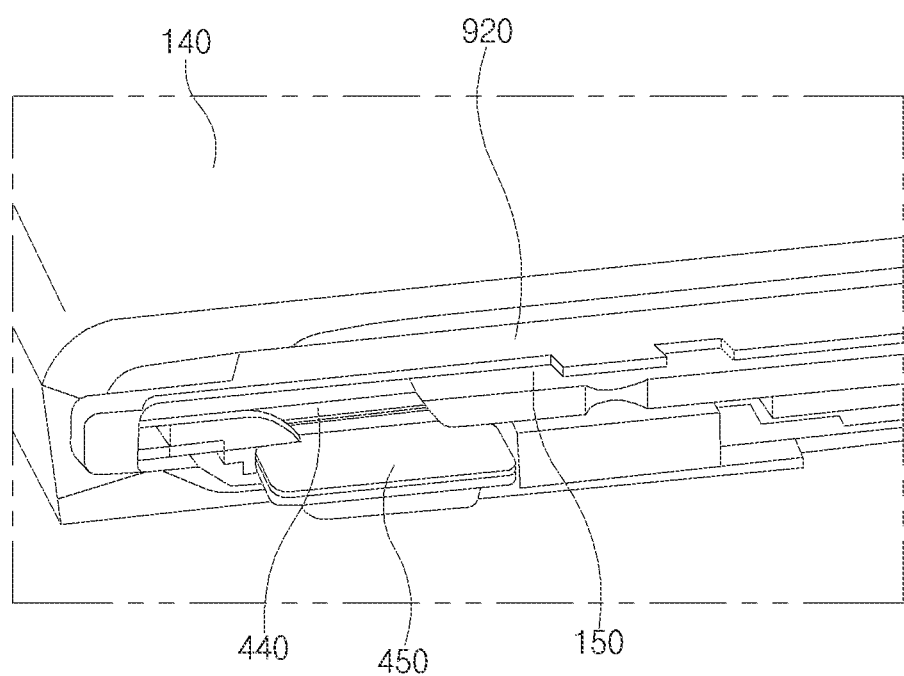

FIG. 9B illustrates another example of a protective holder according to an embodiment of the disclosure.

Referring to FIG. 9B, a protective holder 920 (e.g., the protective holder 155) may not include, in a side surface thereof (a surface not facing the main circuit board 130 or the battery 140), a separate opening though which the flexible printed circuit board 180 passes.

The first portion 410 or the second portion 420 of the flexible printed circuit board 180 may be disposed inside the protective holder 920. The third portion 430 of the flexible printed circuit board 180 may be connected to the outside of the protective holder 920 through an opening formed in a surface of the protective holder 920 that faces the main circuit board 130. The protective holder 920 may be more stable with regard to arrangement than the protective holder 910 of FIG. 9A.

Figure 10:
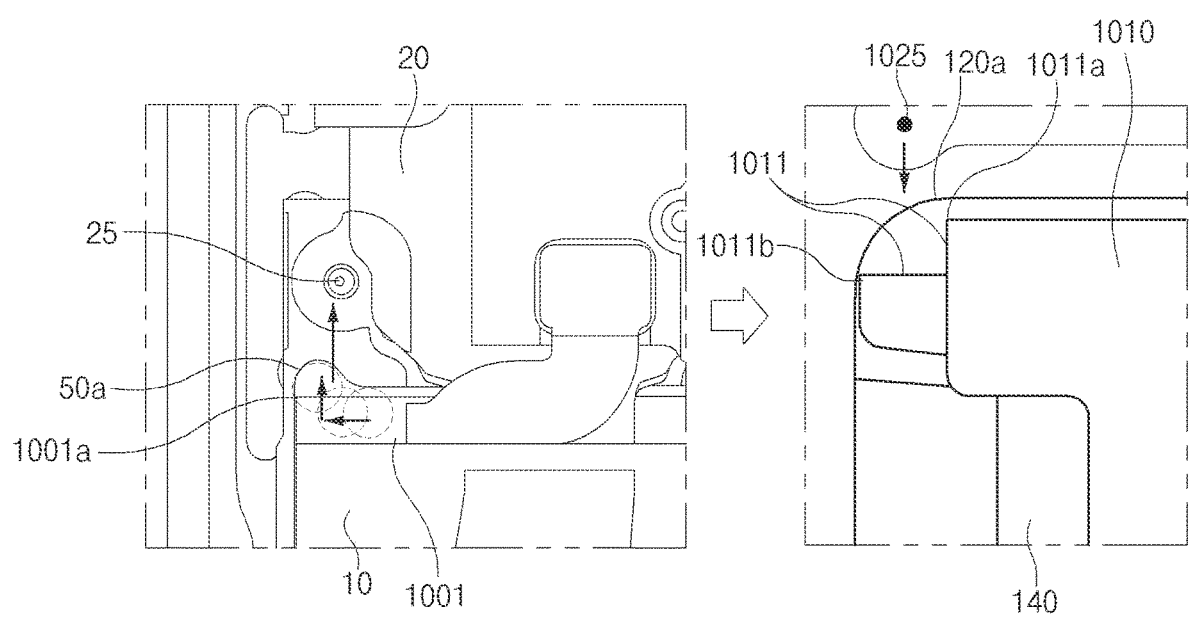
FIG. 10 illustrates a side step of a protective holder according to an embodiment of the disclosure.

FIG. 10 illustrates a side step of a protective holder according to an embodiment of the disclosure.

Referring to FIG. 10, according to an embodiment, a protective holder 1001 (e.g., the protective holder 155) may have a right-angled corner 1001a on a side surface thereof. A battery seating area on which a battery 10 and the protective holder 1001 are seated may include a mechanism movement area 50a additionally extending toward a main circuit board 20 to have a specified gap with the corner 1001a. The mechanism movement area 50a may be formed in the case of manufacturing the battery seating area by a continuous movement of a circular tool.

When the mechanism movement area 50a is included in the battery seating area, a boss hole (or a screw hole) 25 for coupling the main circuit board 20 to a housing may be moved in the direction toward the main circuit board 20 to have a specified gap with the mechanism movement area 50a. Due to this, the space for the main circuit board 20 may be reduced.

According to another embodiment, a protective holder 1010 may include a step structure 1011 on a side surface 1010 thereof. When the protective holder 1010 includes the step structure 1011, a battery seating area may have, in a region adjacent to the protective holder 1010, a curved surface 120a to correspond to the step structure 1011 of the protective holder 1010. The step structure 1011 may be formed on a side surface that is different from the side surface through which the flexible printed circuit board 180 is extracted. A first corner 1011a or a second corner 1011b on the side surface of the protective holder 1010 may have a specified gap with the curved surface 120a and may cope with a movement of the battery 140.

No separate mechanism movement are may be formed around the protective holder 1010. Accordingly, a boss hole (or a screw hole) 1025 may be disposed adjacent to the seating area for the battery 140, and the space for the main circuit board 130 may be expanded.

An electronic device according to various embodiments may include a housing, a main circuit board disposed in the housing, a battery disposed in the housing and electrically connected to the main circuit board, a battery protection module disposed on one side surface of the battery and electrically connected to the inside of the battery, a protective holder that surrounds at least part of the battery protection module, and a flexible printed circuit board that extends from one side surface of the battery protection module and that is connected to the main circuit board. The flexible printed circuit board may include a first portion extending from the battery protection module in a second direction perpendicular to a first direction toward the main circuit board, a second portion extending from the first portion while being bent, a third portion extending from the second portion in a third direction opposite to the second direction, a fourth portion extending from the third portion in the first direction, and a connector connected to an end portion of the fourth portion and connected to the main circuit board.

According to various embodiments, the first direction may be a direction in which electrodes in the battery protrude outside the battery so as to be connected to the battery protection module.

According to various embodiments, the first portion and at least part of the second portion may be disposed inside the protective holder, and the third portion and the fourth portion may be disposed outside the protective holder.

According to various embodiments, the third portion may be disposed over an outer surface of the protective holder.

According to various embodiments, the first to third portions may be disposed inside the protective holder, and at least part of the fourth portion may be exposed outside the protective holder.

According to various embodiments, the first portion, the third portion, or the fourth portion may include V-shaped or W-shaped bending on at least part thereof.

According to various embodiments, the protective holder may include a step structure on a side surface of the protective holder that faces the third direction. The housing may include a specified area in which the battery, the battery protection module, and the protective holder are disposed, and a corner of the specified area that is adjacent to the step structure may have a curved shape.

According to various embodiments, the battery protection module may include a connecting portion connected to the flexible printed circuit board, and the connecting portion may have a greater width than the other portion of the battery protection module.

According to various embodiments, the connecting portion may be disposed over a separating wall between the battery and the main circuit board.

According to various embodiments, the third portion and the fourth portion may be disposed on the same plane and may be formed in an "L" shape.

According to various embodiments, the fourth portion may have a greater width than the first to third portions.

According to various embodiments, the third portion may have a width smaller than, or equal to, a width of the protective holder.

According to various embodiments, the battery protection module may include a first tab and a second tab that are connected to different electrodes in the battery, respectively, and the first portion and the second portion may extend in a direction different from a direction in which the first tab and the second tab protrude.

An electronic device according to various embodiments may include a housing, a main circuit board seated in the housing, a battery seated in the housing and electrically connected to the main circuit board, a battery protection module mounted on one side surface of the battery and electrically connected to the inside of the battery, a protective holder that surrounds the battery protection holder, and a flexible printed circuit board that extends from the battery protection module and that is connected to the main circuit board.

The battery protection module may include, on a first surface thereof, a first tab and a second tab that protrude toward the main circuit board and that are connected to electrode plates in the battery. The flexible printed circuit board may include a first portion connected to a second surface of the battery protection module that is perpendicular to the first surface, a second portion extending from the first portion while being bent in a "U" shape, a third portion that extends from the second portion in parallel to the first portion and that is disposed over the protective holder, a fourth portion extending from the third portion while being bent in an "L" shape, and a connector connected to an end portion of the fourth portion and connected to the main circuit board.

According to various embodiments, the fourth portion may have a greater width than the first to third portions.

According to various embodiments, the protective holder may include a step structure in an area adjacent to a third surface of the battery protection module to which the flexible printed circuit board is not connected.

A battery structure according to various embodiments may include a battery pouch, a first tab and a second tab protruding from the battery pouch in a first direction, a protection module electrically connected with the first tab and the second tab, a protective holder that surrounds at least part of the protection module, and a flexible printed circuit board that extends from one side surface of the protection module and that is connected with an external device. The flexible printed circuit board may include a first portion extending from the one side surface of the protection module in a second direction perpendicular to the first direction, a second portion that extends from the first portion and that is bent in a third direction opposite to the second direction, a third portion extending from the second portion in the third direction, a fourth portion extending from the third portion in the first direction, and a connector connected to an end portion of the fourth portion and connected to the external device.

According to various embodiments, the fourth portion may have a greater width than the first to third portions.

According to various embodiments, the first portion, the third portion, or the fourth portion may include V-shaped or W-shaped bending on at least part thereof.

Figure 11:
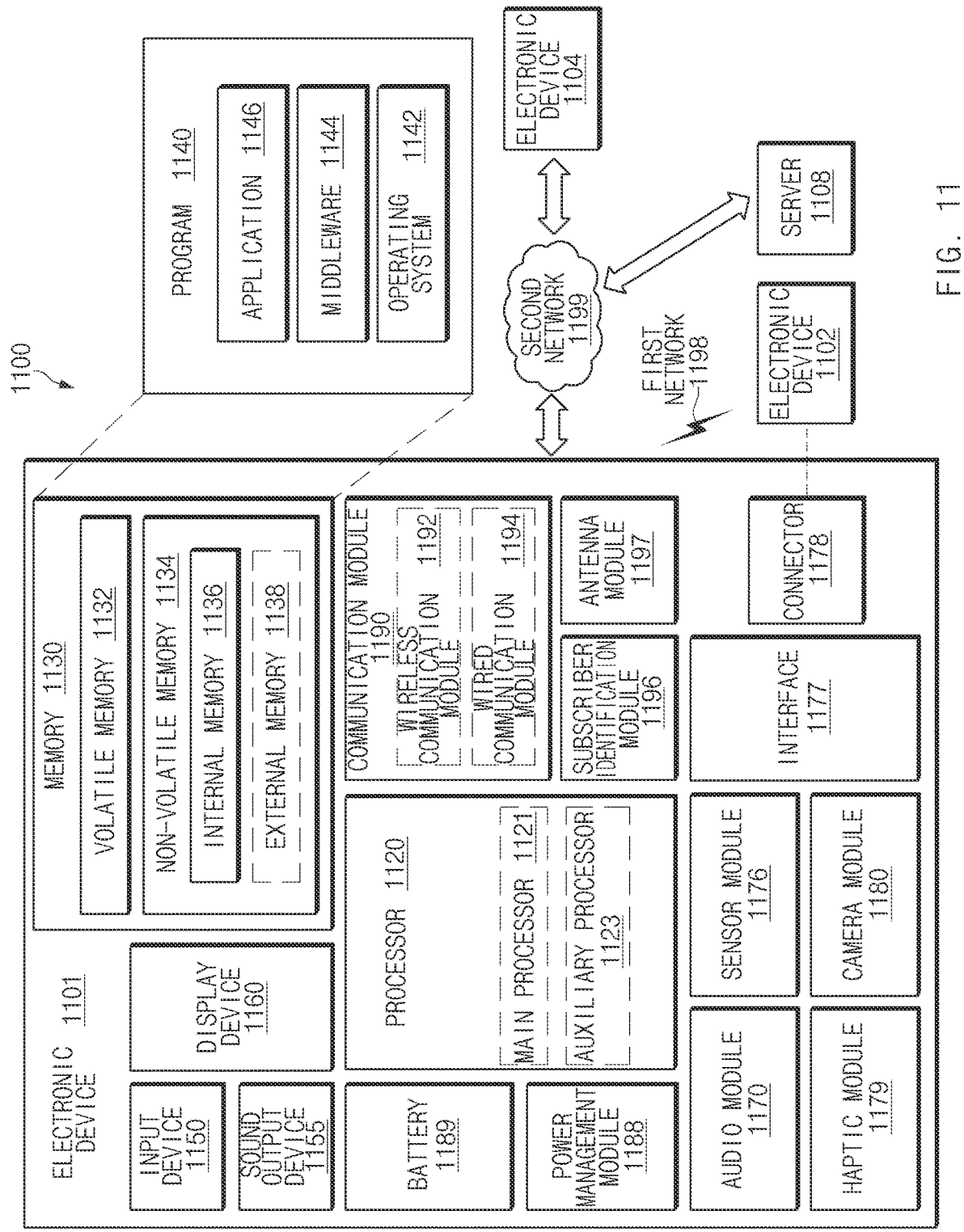
FIG. 11 is a block diagram of an electronic device in a network environment according to an embodiment of the disclosure.

FIG. 11 is a block diagram of an electronic device in a network environment according to an embodiment of the disclosure.

Referring to FIG. 11, the electronic device 1101 may communicate with an electronic device 1102 through a first network 1198 (e.g., a short-range wireless communication network) or may communicate with an electronic device 1104 or a server 1108 through a second network 1199 (e.g., a long-distance wireless communication network) in a network environment 1100. According to an embodiment, the electronic device 1101 may communicate with the electronic device 1104 through the server 1108. According to an embodiment, the electronic device 1101 may include a processor 1120, a memory 1130, an input device 1150, a sound output device 1155, a display device 1160, an audio module 1170, a sensor module 1176, an interface 1177, a haptic module 1179, a camera module 1180, a power management module 1188, a battery 1189, a communication module 1190, a subscriber identification module 1196, or an antenna module 1197. According to some embodiments, at least one (e.g., the display device 1160 or the camera module 1180) among components of the electronic device 1101 may be omitted or one or more other components may be added to the electronic device 1101. According to some embodiments, some of the above components may be implemented with one integrated circuit. For example, the sensor module 1176 (e.g., a fingerprint sensor, an iris sensor, or an illuminance sensor) may be embedded in the display device 1160 (e.g., a display).

The processor 1120 may execute, for example, software (e.g., a program 1140) to control at least one of other components (e.g., a hardware or software component) of the electronic device 1101 connected to the processor 1120 and may process or compute a variety of data. According to an embodiment, as a part of data processing or operation, the processor 1120 may load a command set or data, which is received from other components (e.g., the sensor module 1176 or the communication module 1190), into a volatile memory 1132, may process the command or data loaded into the volatile memory 1132, and may store result data into a nonvolatile memory 1134. According to an embodiment, the processor 1120 may include a main processor 1121 (e.g., a central processing unit or an application processor) and an auxiliary processor 1123 (e.g., a graphic processing device, an image signal processor, a sensor hub processor, or a communication processor), which operates independently from the main processor 1121 or with the main processor 1121. Additionally or alternatively, the auxiliary processor 1123 may use less power than the main processor 1121, or is specified to a designated function. The auxiliary processor 1123 may be implemented separately from the main processor 1121 or as a part thereof.

The auxiliary processor 1123 may control, for example, at least some of functions or states associated with at least one component (e.g., the display device 1160, the sensor module 1176, or the communication module 1190) among the components of the electronic device 1101 instead of the main processor 1121 while the main processor 1121 is in an inactive (e.g., sleep) state or together with the main processor 1121 while the main processor 1121 is in an active (e.g., an application execution) state. According to an embodiment, the auxiliary processor 1123 (e.g., the image signal processor or the communication processor) may be implemented as a part of another component (e.g., the camera module 1180 or the communication module 1190) that is functionally related to the auxiliary processor 1123.

The memory 1130 may store a variety of data used by at least one component (e.g., the processor 1120 or the sensor module 1176) of the electronic device 1101. For example, data may include software (e.g., the program 1140) and input data or output data with respect to commands associated with the software. The memory 1130 may include the volatile memory 1132 or the nonvolatile memory 1134. The nonvolatile memory 1134 may include an internal memory 1136 or an external memory 1138.

The program 1140 may be stored in the memory 1130 as software and may include, for example, a kernel 1142 (i.e., an operating system), a middleware 1144, or an application 1146.

The input device 1150 may receive a command or data, which is used for a component (e.g., the processor 1120) of the electronic device 1101, from an outside (e.g., a user) of the electronic device 1101. The input device 1150 may include, for example, a microphone, a mouse, a keyboard, or a digital pen (e.g., a stylus pen).

The sound output device 1155 may output a sound signal to the outside of the electronic device 1101. The sound output device 1155 may include, for example, a speaker or a receiver. The speaker may be used for general purposes, such as multimedia play or recordings play, and the receiver may be used for receiving calls. According to an embodiment, the receiver and the speaker may be either integrally or separately implemented.

The display device 1160 may visually provide information to the outside (e.g., the user) of the electronic device 1101. For example, the display device 1160 may include a display, a hologram device, or a projector and a control circuit for controlling a corresponding device. According to an embodiment, the display device 1160 may include a touch circuitry configured to sense the touch or a sensor circuit (e.g., a pressure sensor) for measuring an intensity of pressure on the touch.

The audio module 1170 may convert a sound and an electrical signal in dual directions. According to an embodiment, the audio module 1170 may obtain the sound through the input device 1150 or may output the sound through the sound output device 1155 or an external electronic device (e.g., the electronic device 1102 (e.g., a speaker or a headphone)) directly or wirelessly connected to the electronic device 1101.

The sensor module 1176 may generate an electrical signal or a data value corresponding to an operating state (e.g., power or temperature) inside or an environmental state (e.g., a user state) outside the electronic device 1101. According to an embodiment, the sensor module 1176 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 1177 may support one or more designated protocols to allow the electronic device 1101 to connect directly or wirelessly to the external electronic device (e.g., the electronic device 1102). According to an embodiment, the interface 1177 may include, for example, a high-definition multimedia interface (HDMI), a universal serial bus (USB) interface, a secure digital (SD) card interface, or an audio interface.

A connecting terminal 1178 may include a connector that physically connects the electronic device 1101 to the external electronic device (e.g., the electronic device 1102). According to an embodiment, the connecting terminal 1178 may include, for example, an HDMI connector, a USB connector, an SD card connector, or an audio connector (e.g., a headphone connector).

The haptic module 1179 may convert an electrical signal to a mechanical stimulation (e.g., vibration or movement) or an electrical stimulation perceived by the user through tactile or kinesthetic sensations. According to an embodiment, the haptic module 1179 may include, for example, a motor, a piezoelectric element, or an electric stimulator.

The camera module 1180 may shoot a image or a video image. According to an embodiment, the camera module 1180 may include, for example, at least one or more lenses, image sensors, image signal processors, or flashes.

The power management module 1188 may manage power supplied to the electronic device 1101. According to an embodiment, the power management module 1188 may be implemented as at least a part of a power management integrated circuit (PMIC).

The battery 1189 may supply power to at least one component of the electronic device 1101. According to an embodiment, the battery 1189 may include, for example, a non-rechargeable (primary) battery, a rechargeable (secondary) battery, or a fuel cell.

The communication module 1190 may establish a direct (e.g., wired) or wireless communication channel between the electronic device 1101 and the external electronic device (e.g., the electronic device 1102, the electronic device 1104, or the server 1103) and support communication execution through the established communication channel. The communication module 1190 may include at least one communication processor operating independently from the processor 1120 (e.g., the application processor) and supporting the direct (e.g., wired) communication or the wireless communication. According to an embodiment, the communication module 1190 may include a wireless communication module (or a wireless communication circuit) 1192 (e.g., a cellular communication module, a short-range wireless communication module, or a global navigation satellite system (GNSS) communication module) or a wired communication module 1194 (e.g., an local area network (LAN) communication module or a power line communication module). The corresponding communication module among the above communication modules may communicate with the external electronic device through the first network 1198 (e.g., the short-range communication network such as a Bluetooth, a Wi-Fi direct, or an infrared data association (IrDA)) or the second network 1199 (e.g., the long-distance wireless communication network such as a cellular network, an internet, or a computer network (e.g., LAN or wide area network (WAN))). The above-mentioned various communication modules may be implemented into one component (e.g., a single chip) or into separate components (e.g., chips), respectively. The wireless communication module 1192 may identify and authenticate the electronic device 1101 using user information (e.g., international mobile subscriber identity (IMSI)) stored in the subscriber identification module 1196 in the communication network, such as the first network 1198 or the second network 1199.

The antenna module 1197 may transmit or receive a signal or power to or from the outside (e.g., an external electronic device). According to an embodiment, the antenna module may include one antenna including a radiator made of a conductor or conductive pattern formed on a substrate (e.g., a PCB). According to an embodiment, the antenna module 1197 may include a plurality of antennas. In this case, for example, the communication module 1190 may select one antenna suitable for a communication method used in the communication network such as the first network 1198 or the second network 1199 from the plurality of antennas. The signal or power may be transmitted or received between the communication module 1190 and the external electronic device through the selected one antenna. According to some embodiments, in addition to the radiator, other parts (e.g., an RFIC) may be further formed as a portion of the antenna module 1197.

At least some components among the components may be connected to each other through a communication method (e.g., a bus, a general purpose input and output (GPIO), a serial peripheral interface (SPI), or a mobile industry processor interface (MIPI)) used between peripheral devices to exchange signals (e.g., a command or data) with each other.

According to an embodiment, the command or data may be transmitted or received between the electronic device 1101 and the external electronic device 1104 through the server 1103 connected to the second network 1199. Each of the electronic devices 1102 and 1104 may be the same or different types as or from the electronic device 1101. According to an embodiment, all or some of the operations performed by the electronic device 1101 may be performed by one or more external electronic devices among the external electronic devices 1102, 1104, or 1108. For example, when the electronic device 1101 performs some functions or services automatically or by request from a user or another device, the electronic device 1101 may request one or more external electronic devices to perform at least some of the functions related to the functions or services, in addition to or instead of performing the functions or services by itself. The one or more external electronic devices receiving the request may carry out at least a part of the requested function or service or the additional function or service associated with the request and transmit the execution result to the electronic device 1101. The electronic device 1101 may provide the result as is or after additional processing as at least a part of the response to the request. To this end, for example, a cloud computing, distributed computing, or client-server computing technology may be used.

An electronic device according to various embodiments of the present disclosure may be various types of devices. The electronic device may include, for example, a portable communication device (e.g., a smartphone), a computer device, a portable multimedia device, a portable medical device, a camera, a wearable device, or a home appliance. The electronic device according to embodiments of the present disclosure is not limited to the above-described devices.

Various embodiments of the present document and terminology used herein are not intended to limit the technical features described in the present specification to specific embodiments, but should be understood to include various changes, equivalents, or substitutes for the embodiments. In connection with the description of the drawings, similar reference numerals may be used for similar or related components. The singular form of the noun corresponding to the item may include one or more of the items, unless the context clearly indicates otherwise. In this document, "A or B", "at least one of A and B", "at least one of A or B", "A, B or C", "at least one of A, B and C", and "A Phrases such as "at least one of, B, or C" may include any one of the items listed together in the corresponding one of the phrases, or any possible combination thereof. Terms such as "first", "second", or "first" or "second" may be used merely to distinguish a component from other corresponding components, and to separate the components from other aspects (e.g., importance or order). When some (e.g., first) component may be referred to as "coupled" or "connected" to another (e.g., second) component, with or without the term "functionally" or "communically", it means that any component can be connected directly to the other component (e.g., by wire), wirelessly, or via a third component.

As used herein, the term "module" may include a unit implemented in hardware, software, or firmware, and may be used interchangeably with terms such as logic, logic blocks, components, or circuits. The module may be an integral part or a minimum unit or part of the component, which performs one or more functions. For example, according to one embodiment, the module may be implemented in the form of an application-specific integrated circuit (ASIC).

Various embodiments of the present disclosure may include one or more instructions stored in a storage medium (e.g., internal memory 1136 or external memory 1138) that can be read by a machine (e.g., electronic device 1101). It may be implemented as software (e.g., program 1140) including the. For example, the processor (e.g., the processor 1120) of the device (e.g., the electronic device 1101) may call and execute at least one of the one or more instructions stored from the storage medium. This enables the device to be operated to perform at least one function in accordance with the at least one command invoked. The one or more instructions may include code generated by a compiler or code executable by an interpreter. The device-readable storage medium may be provided in the form of a non-transitory storage medium. Here, "non-transitory" simply means that the storage medium is a tangible device and does not contain a signal (e.g., an electromagnetic wave). There is no distinction between the case of being stored semi-permanently on the medium and the case of being stored temporarily.

According to one embodiment, a method according to various embodiments disclosed herein may be provided included in a computer program product. The computer program product may be traded between the seller and the buyer as a product. The computer program product may be distributed in the form of a device-readable storage medium (e.g., compact disc read only memory (CD-ROM)), or through an application store (e.g., Play Store™) or two user devices (e.g., smartphones) may be distributed (e.g., downloaded or uploaded) directly or online. In the case of on-line distribution, at least a portion of the computer program product may be stored at least temporarily on a device-readable storage medium such as a server of a manufacturer, a server of an application store, or a relay server, or may be temporarily created.

According to various embodiments, each component (e.g., module or program) of the above-described components may include a singular or plural entity. According to various embodiments, one or more of the aforementioned components or operations may be omitted, or one or more other components or operations may be added. Alternatively or additionally, a plurality of components (e.g., a module or a program) may be integrated into one component. In this case, the integrated component may perform one or more functions of the component of each of the plurality of components the same as or similar to that performed by the corresponding component of the plurality of components before the integration. According to various embodiments, operations performed by a module, program, or other component may be executed sequentially, in parallel, repeatedly, or heuristically, or one or more of the operations may be executed in a different order, omitted or one or more other actions may be added.

The electronic device according to the various embodiments of the disclosure includes the flexible printed circuit board extracted from the side of the battery protection module and bent in the "U" shape, thereby reducing stress applied to the flexible printed circuit board and achieving an increase in the arrangement space of the main circuit board in the electronic device.

The electronic device according to the various embodiments of the disclosure includes the step structure on the side surface of the protective holder surrounding the battery protection module, thereby achieving a reduction in the arrangement space of the battery.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. A portable communication device comprising:
   a housing;
   a first printed circuit board (PCB) disposed in the housing and including at least one of an application processor, memory, a communication chip, or a sensor disposed thereon;
   a battery disposed in the housing;
   a battery protection module disposed between the first PCB and a lateral surface of the battery, the battery protection module including a second PCB including a protection integrated circuit (IC) disposed thereon and electrically connected to an inside of the battery;
   a tape covering the battery protection module; and
   a flexible printed circuit board (FPCB) including a first connecting portion and a second connecting portion connected to the battery protection module and the first PCB, respectively, the FPCB further including a first FPCB portion extending from the first connecting portion in a first direction parallel to the lateral surface of the battery, a second FPCB portion extending upwardly from the first FPCB portion as bent, a third FPCB portion extending from the second FPCB portion over the first FPCB portion in a second direction opposite to the first direction, and a fourth FPCB portion extending from the third FPCB portion in a third direction perpendicular to the second direction and facing toward the first PCB, the first FPCB portion being at least partially covered by the tape, and a an entire portion of the third FPCB portion extending along an outer surface of the tape and not being covered by the tape.

2. The portable communication device of claim 1, wherein the housing includes a rear case, and
   wherein when viewed from the rear case, the third FPCB portion is placed on top of the tape.

3. The portable communication device of claim 2, wherein when viewed from the rear case, the fourth FPCB portion is not placed on top of the tape.

4. The portable communication device of claim 1 further comprising:
   a display;
   wherein when viewed from a direction in which the display is facing, the third FPCB portion is placed on bottom of the tape.

5. The portable communication device of claim 4, wherein when viewed from a direction in which the display is facing, the fourth FPCB portion is not placed on bottom of the tape.

6. The portable communication device of claim 1, wherein the tape covers at least part of the battery.

7. The portable communication device of claim 1, wherein the first direction is a direction toward a first side surface of the portable communication device.

8. The portable communication device of claim 1, wherein the second direction is a direction toward a second side surface of the portable communication device.

9. The portable communication device of claim 1, wherein the battery includes a plurality of electrodes disposed along the third direction and connected to the battery protection module.

10. The portable communication device of claim 1, wherein the housing includes a partition disposed between the first PCB and the battery and, wherein the fourth FPCB portion is disposed as crossing over the partition.

11. The portable communication device of claim 1, wherein at least one of the first FPCB portion, the third FPCB portion, or the fourth FPCB portion comprises a V-shaped bending portion or a W-shaped bending portion on at least a part thereof.

12. The portable communication device of claim 1, wherein a width of the first FPCB portion and a width of the third FPCB portion are the same.

13. The portable communication device of claim 1, wherein a width of the fourth FPCB portion is greater than a width of the third FPCB portion.

14. The portable communication device of claim 1, wherein a width of the second connecting portion is greater than a width of the fourth FPCB portion.

15. The portable communication device of claim 1, wherein the third FPCB portion and the fourth FPCB portion are disposed on the same plane and are formed in an "L" shape.

16. The portable communication device of claim 1, wherein the second FPCB portion forms a "U" shape.

* * * * *